(12) United States Patent
Miksch

(10) Patent No.: US 6,549,415 B2
(45) Date of Patent: Apr. 15, 2003

(54) ALIGNMENT OF REMOVABLE SUBASSEMBLY

(75) Inventor: Eugene A Miksch, Loveland, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 29 days.

(21) Appl. No.: 09/912,003

(22) Filed: Jul. 24, 2001

(65) Prior Publication Data

US 2003/0021090 A1 Jan. 30, 2003

(51) Int. Cl.[7] ................................................. G06F 1/16
(52) U.S. Cl. ........................ 361/725; 361/801; 439/716; 312/211
(58) Field of Search .............................. 361/724–727, 361/680–687, 732, 740, 741, 796, 799–802; 439/347, 732, 716; 312/211; 248/225.2

(56) References Cited

U.S. PATENT DOCUMENTS

| 5,045,960 A | | 9/1991 | Eding ...................... 360/97.01 |
| 5,074,801 A | * | 12/1991 | Siemon ...................... 439/188 |
| 5,077,722 A | | 12/1991 | Geist et al. ................. 369/75.1 |
| 5,269,698 A | | 12/1993 | Singer ......................... 439/157 |
| 5,325,263 A | | 6/1994 | Singer et al. ................ 361/683 |
| 5,333,097 A | | 7/1994 | Christensen et al. ........ 361/685 |
| 5,590,027 A | * | 12/1996 | Provenzale .................. 361/732 |
| 5,602,717 A | | 2/1997 | Leshem et al. ............. 361/685 |
| 5,737,184 A | | 4/1998 | Lai ............................. 361/683 |
| 6,049,452 A | * | 4/2000 | You et al. ................... 361/725 |
| 6,158,105 A | | 12/2000 | Suh .............................. 29/453 |
| 6,181,552 B1 | | 1/2001 | Neville, Jr. et al. ......... 361/686 |
| 6,202,291 B1 | | 3/2001 | Toedtman .................... 29/739 |
| 6,393,685 B1 | * | 5/2002 | Collins ........................ 29/428 |

* cited by examiner

Primary Examiner—Darren Schuberg
Assistant Examiner—Hung Van Duong

(57) ABSTRACT

A first unit comprises a projection having a first planar portion and a second planar portion, which intersect at an angle. The projection is an extension of the first unit, has a linear axis, and is perpendicular to a base end of the first unit. A second unit comprises a mounting face and a receptacle. The receptacle has a shape for receiving and holding the projection. The base end is aligned with the mounting face by inserting the projection into the receptacle. The receptacle engages the first planar portion and the second planar portion, thereby preventing rotation of the projection, the first unit and the second unit about the linear axis.

18 Claims, 4 Drawing Sheets

ALIGNMENT OF REMOVABLE SUBASSEMBLY

FIELD OF THE INVENTION

The invention is related to the field of aligning machine components, in particular, to the alignment of an interconnection between a main unit of an assembly and a removable subassembly.

BACKGROUND OF THE INVENTION

Statement of the Problem

Modular design and construction of machines and electronic instruments provides numerous advantages. It allows separate fabrication of individual units and subassemblies. Further, it allows convenient removal of an individual unit or subassembly from a system, and its efficient replacement by a substitute unit or subassembly. Modular operation is particularly useful in a system that includes a plurality of identical or similar functional modules that may not be shut down for repair or maintenance.

Improper or imprecise alignment of a modular unit or subassembly during its replacement into a system commonly interferes with proper operation or causes damage. For example, modular design and operation of a system typically requires one or more forms of interconnection between the system and separate units and subassemblies. A common form of electrical interconnection includes a plug having a plurality of pins that is inserted into a jack having corresponding pin-holes. Improper alignment commonly causes unsatisfactory electrical interconnection. It also commonly damages plug pins and other components of interconnection devices.

Modular assembly of a system typically requires mechanical support of a modular subassembly. Improper or insecure mechanical alignment of a modular subassembly in the system commonly results in improper operation or damage to components.

U.S. Pat. No. 5,602,717, issued Feb. 11, 1997 to Lesham et al., discloses a data storage mechanical interlock subassembly including a first extending rigid pin for pre-aligning, and a second extending rigid pin for fine aligning. The disclosed pins are apparently conical, and the apertures for accepting the pins are apparently circular. U.S. Pat. No. 5,325,263, issued Jun. 28, 1994 to Singer et al., discloses locating pins having a tapered tip intended to easily slide into a locating member or hole. The locating pins preferably have a criss-cross cross-sectional area. The locating pins are apparently individual pieces connected to a chassis or frame. The locating holes for accepting the pins are apparently circular. U.S. Pat. No. 6,202,291 B1, issued Mar. 20, 2001 to Toedtman, discloses an alignment device including single-plane alignment tips formed in a triangle or wedge shape. The tips are separate pieces attached to signal or power alignment plugs.

SUMMARY OF THE INVENTION

The invention helps to solve some of the problems mentioned above by providing a system for aligning two units of a modular system, comprising: a projection extending from a base region of a first unit, the projection having a first planar portion and a second planar portion; and a receptacle in a mounting region of a second unit, the receptacle having a shape for receiving the projection and engaging the first and second planar portions. The first planar portion and the second planar portion form an intersection with an intersection angle in a range of from 10° to 170°. The projection extends in a direction substantially perpendicular to a base panel in the base region. The projection has a base end proximate to the base region and a tip end distal from the base region, and the tip end is tapered so that the base end has larger dimensions than the tip end. Typically, the first planar portion and the second planar portion are substantially perpendicular to each other; that is, the intersection angle between the first planar portion and the second planar portion is typically about 90°. Typically, the receptacle is a slot in the mounting region.

In preferred embodiments, the tip end of the projection fits loosely in the receptacle, and the receptacle holds the base end of the projection tightly when the projection is inserted fully into the receptacle such that the base panel of the first unit is in contact with at least a portion of a mounting face of the second unit. The intersection of the first planar portion and the second planar portion forms a substantially linear axis perpendicular to the base region. An advantage of a system in accordance with the invention is that the receptacle engages the first planar portion and the second planar portion to prevent rotation of either the first unit or second unit around the linear axis when the projection is inserted fully into the receptacle. In certain embodiments, the receptacle tightly engages the first planar portion and a second planar portion at the base end, but does not tightly engage the intersection of the first and second planar portions. Typically, at least a portion of the base region of the first unit comprises a rigid material, and the projection is an extension of the rigid material. In typical embodiments in accordance with the invention, the first unit has a shape of a rectangular box, and the base panel is a rectangular side of the box. Typically, the first unit comprises a housing of rigid material, a housing includes the top, the bottom, a first side and a second side, and the projection is an extension of the housing. Typically, the rigid material comprises sheet metal. Typically, the projection is an extension of a corner region of the housing, and the first planar portion and the second planar portion are formed by a fold in the projection. A system in accordance with the invention may comprise one or a plurality of projections and mating receptacles.

A system in accordance with the invention is particularly useful for aligning a removable subassembly in a main assembly. On-line replaceable modular subassemblies are quickly and properly aligned for interconnection with main assembly units. For example, a system in accordance with the invention is useful for reliable and proper aligning of redundant power supply subassemblies with a computer server.

BRIEF DESCRIPTION OF THE DRAWINGS

A more complete understanding of the invention may be obtained by reference to the drawings, in which.

DESCRIPTION OF THE INVENTION

The invention is described herein with reference to FIGS. 1–6. It should be understood that the structures and systems depicted in schematic form in FIGS. 1–6 serve explanatory purposes and are not precise depictions of actual structures and systems in accordance with the invention. Furthermore, the embodiments described herein are exemplary and are not intended to limit the scope of the invention, which is defined in the claims below.

Figure 1:
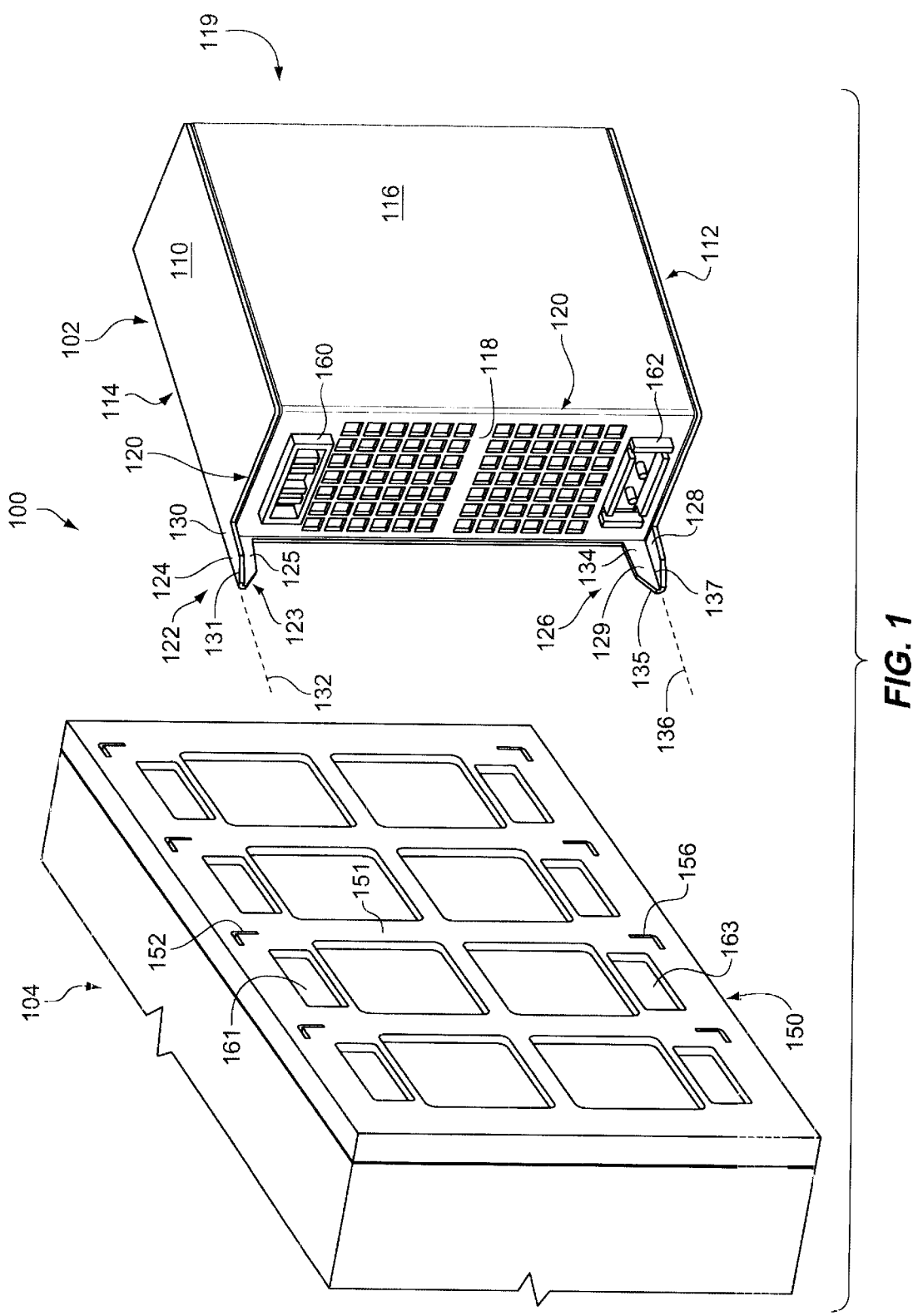
FIG. 1 depicts an alignment system in accordance with the invention including a first unit, a second unit and two projections.

FIG. 1 depicts an alignment system 100 in accordance with the invention including a first unit 102 and a second unit 104. Typically, a first unit 102 is a subassembly 102 of an assembly including central second unit 104. For example, as depicted in FIG. 1, first unit 102 is a power supply to be connected to computer unit 104. First unit 102 has a shape of a rectangular box with a top 110, a bottom 112, a first side 114, a second side 116, a base panel 118 perpendicular to the top, bottom and sides, and a far panel 119 parallel to base panel 118. A base region 120 of first unit 102 is located proximate to base panel 118. First unit 102 further comprises a top corner projection 122. Top projection 122 includes a first planar portion 124 and a second planar portion 125. First unit 102 also comprises a bottom corner projection 126, including a first planar portion 128 and a second planar portion 129. Projection 124 has a base end 130 proximate to base region 120, and a tip end 131 distal from base region 120. Tip end 131 is tapered so that base end 130 has larger dimensions than tip end 131. Similarly, projection 126 has a base end 134 proximate to base region 120 and a tip end 135 distal from base region 120, and tip end 135 is tapered so that the base end has larger dimensions than the tip end. First unit 102 typically includes a housing of rigid material, such as sheet metal. In FIG. 1, top 110, bottom 112, and sides 114, 116 are formed by rigid sheet metal. Projection 122 is an extension of housing material in a direction substantially perpendicular to base panel 118. Similarly, projection 126 is an extension of housing material in a direction perpendicular to base panel 118. Planar regions 124, 125 of projection 122 are formed by a fold 123 in the sheet metal of projection 122. Where first planar portion 124 and second planar portion 126 intersect at fold 123 of the sheet metal or other rigid material, they form a substantially linear axis 132 perpendicular to base panel 118. Linear axis 132 is indicated in FIG. 1 by a dashed line extending in the direction of projection 122. Similarly, the intersection 137 at the fold of planar portions 128, 129 of projection 126 forms a linear axis 136 perpendicular to base panel 118.

Second unit 104 of system 100 includes a mounting region 150 having a mounting face 151. Mounting region 150 includes a top receptacle 152 having a shape for receiving and holding projection 122. Similarly, mounting region 150 includes a bottom receptacle 156 having a shape for receiving and holding projection 126. Subassembly first unit 102 is correctly aligned with main assembly second unit 104 by inserting the tapered tip ends of projections 122, 126 into receptacles 152, 156, respectively, and then completely pushing the projections into the receptacles so that base panel 118 is in contact with mounting face 152. A tapered tip end allows convenient initial insertion and course alignment, followed by gradual pinching of the first and second planar portions as the projection is inserted further. After projection 122 is fully inserted into receptacle 152, receptacle 152 tightly engages by friction, or pinches, first planar portion 124 and second planar portion 125. As a result, receptacle 152 prevents rotation of projection 122, first unit 102 or second unit 104 around linear axis 132. Similarly, after projection 126 is fully inserted into receptacle 156, receptacle 156 tightly engages first planar portion 128 and second planar portion 129. As a result, receptacle 156 prevents rotation of projection 126, first unit 102 or second unit 104 around linear axis 136. Subassembly first unit 102 comprises electrical connector plugs 160, 162 for mating with connector holes 161, 163, respectively. As insertion of projections 122, 126 into receptacles 152, 156 is completed, subassembly first unit 102 is correctly aligned with second unit 104, so that mating of connector plugs with connector holes proceeds without damage. Because tip ends 131, 135 are tapered, course alignment of first unit 102 and second unit 104 is facilitated. The shape and dimensions of receptacles 152, 156 are designed to form a tight fit around base ends 130, 134, respectively. As a result, proper fine alignment of the units is achieved. In addition, the tight fit provides a means of physically securing and supporting subassembly first unit 102 in its operational location connected to second unit 104.

Terms of orientation, such as "top", "bottom", "side" and others, are used with reference to the embodiments as depicted in the accompanying figures. It is understood, however, that a system in accordance with the invention may be spatially oriented in many orientations and positions different from those depicted in FIGS. 1–6.

Figure 2:
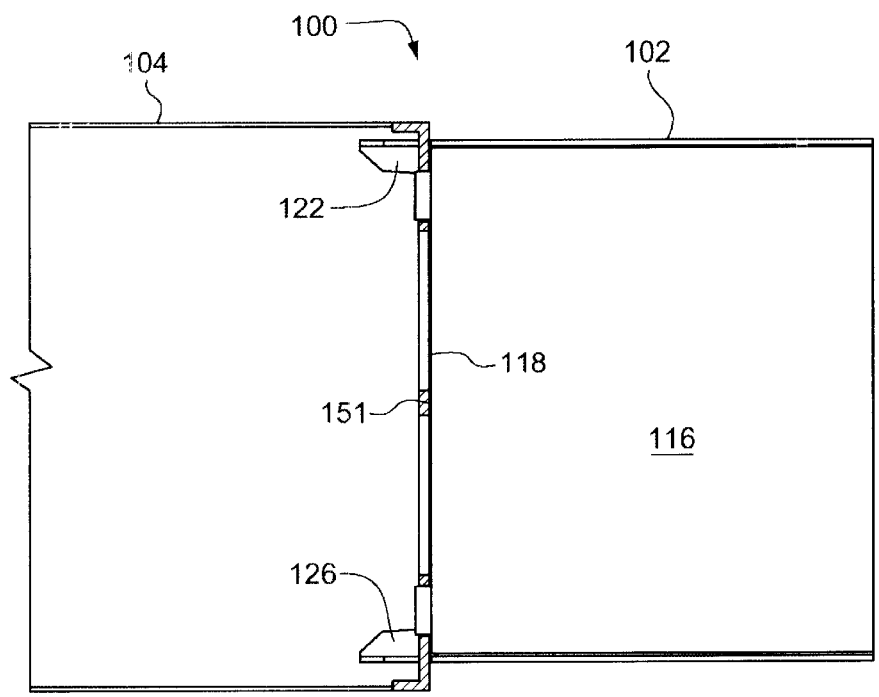
FIG. 2 is a cross-sectional view of system depicting a first unit operationally connected to a second unit, whereby the projections are fully inserted into the receptacles.
Figure 3:
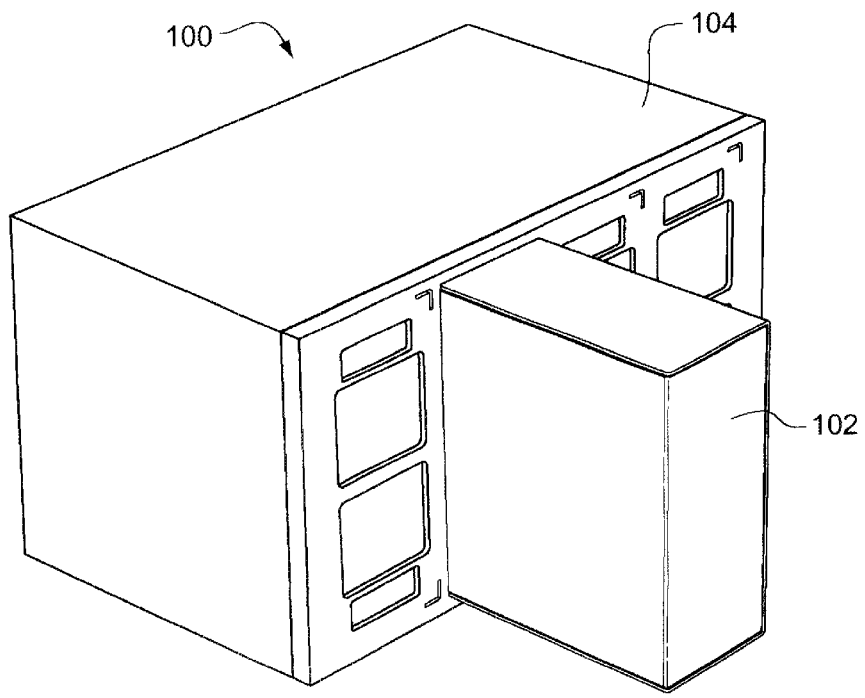
FIG. 3 is a top perspective view showing a first unit operationally connected to a second unit.

FIG. 2 is a cross-sectional view of system 100 depicting in schematic form first unit 102 operationally connected to second unit 104, whereby projections 122, 126 are fully inserted into receptacles 152, 156, respectively. FIG. 3 is a top perspective view showing first unit 102 operationally connected to second unit 104.

Figure 4:
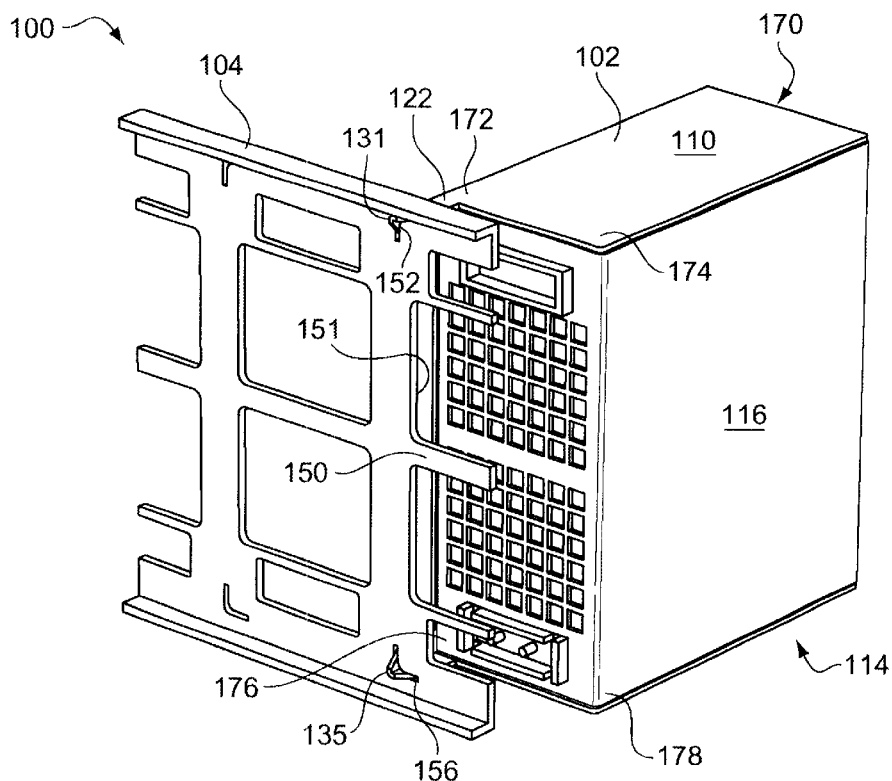
FIG. 4 is a cut-away perspective view in which a subassembly first unit is coarsely aligned at a mounting face of a main assembly second unit.
Figure 5:
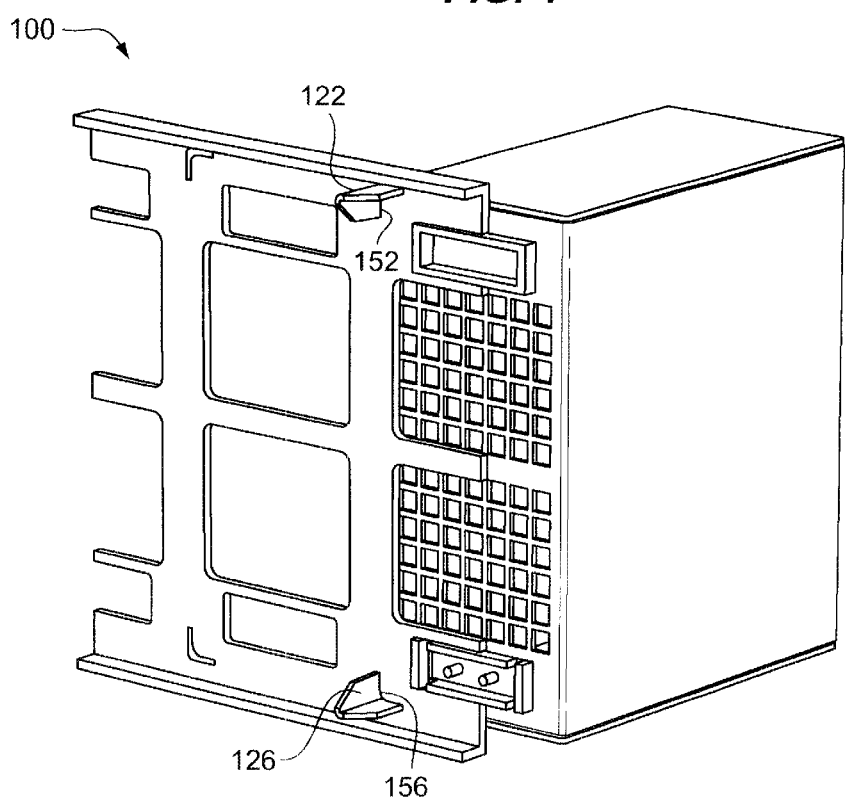
FIG. 5 depicts the subassembly of FIG. 4 moved further into engagement and fine alignment.

FIG. 4 depicts in schematic form a cut-away perspective view of system 100 in which subassembly first unit 102 is coarsely aligned at mounting face 151 of mounting region 150 of main assembly second unit 104. Projections 122, 126 are partially inserted into receptacles 152, 156, respectively. Receptacles 152, 156 are shaped to have relatively large tolerances as projections 122, 126 enter the receptacles, and base panel 118 begins to align itself with mounting face 151. For example, during initial course alignment with tapered tip 131 in receptacle 152, tolerances in a range of from about 1 to 3 mm are typical. As depicted in FIG. 5, as the subassembly 102 is moved further into engagement, the planar portions of the projections enter further into receptacles 152, 156, which engage, or pinch, the planar portions more tightly. When fully seated, receptacle 152, 156 fully engage projections 122, 126 with tighter tolerances; for example, in a range of from 0.1 to 0.3 mm. To facilitate initial insertion of tapered tip ends 131, 135 into receptacles 152, 156 for coarse alignment, corners in receptacles 152, 156 preferably are "rounded". In general, receptacles in a system are typically widened at certain selected portions of the receptacles to make initial insertion of the projection easier, while not sacrificing precision of the final, fine alignment. This is discussed in more detail with reference to FIG. 6, below.

First unit 102 in FIG. 4 has a housing 170 of rigid material, typically sheet metal, which in the base region includes a first top corner region 172, located about an edge formed by first side 114 and top 110. The housing in the base region further includes: a second top corner region 174, located about an edge formed by second side 116 and top 110; a first bottom corner region 176 located about an edge formed by first side 114 and bottom 112; and a second bottom corner region 178, located about an edge formed by second side 116 and bottom 112. In a typical embodiment, a projection in accordance with the invention is an extension of a region of housing selected from the group consisting of first top corner region 172, second top corner region 174, first bottom corner region 176, and second bottom corner region 178.

Figure 6:
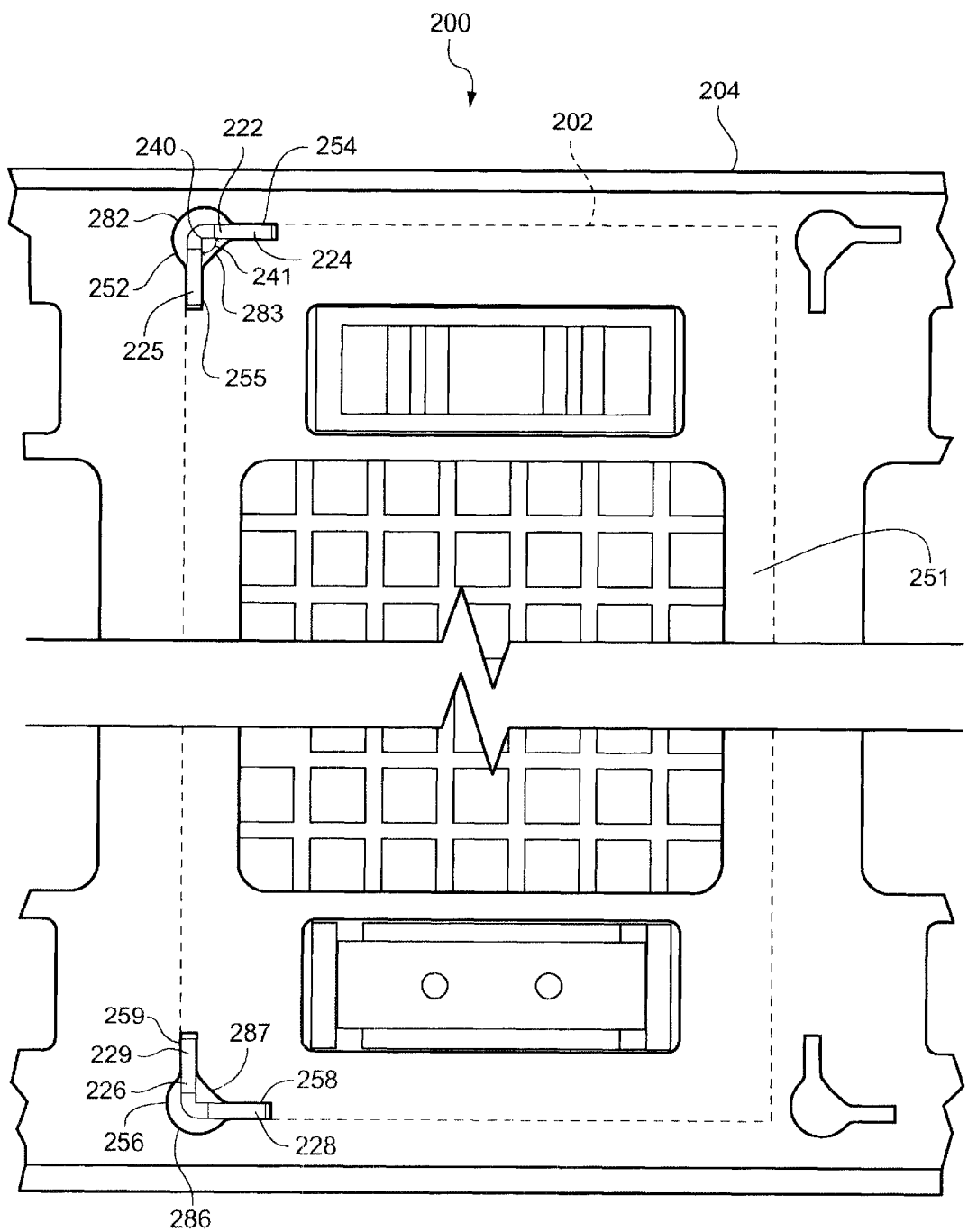
FIG. 6 depicts in schematic form a cut-away perspective view of an exemplary system in which a power supply subassembly was aligned with a computer server assembly.

FIG. 6 depicts in schematic form an inside elevation view of a system 200 in which a power supply subassembly 202 was aligned in accordance with the invention with a computer server 204. Slots were punched in a sheet metal mounting face 251 and functioned as receptacles 252, 256 for projections 222, 226 of first unit subassembly 202. Mounting face 251 had a thickness of about 2 mm, which was the depth of the receptacle slots. Projections 222, 226 had a total length of approximately 20 mm. Planar portions 224, 225 and 228, 229 each had a maximum width at the base ends of about 8 mm. The length of the tapered tip ends was about 6 mm. Receptacles 252, 256 were shaped to have relatively large tolerances for course alignment, as the tips of projections 222, 226 were inserted into the receptacles. In the region of intersection 240 of first planar portion 224 and second planar portion 225 along a linear axis perpendicular to the base region (such as linear axis 132 discussed with reference to FIG. 1), projection 222 had a 90° intersection angle 241. The outer corner region 282 and inner corner region 283 of receptacle 252 were fabricated to be wider and rounder than the hard 90° angle corresponding to the shape of projection 222. This allowed easier initial, course alignment. On the other hand, planar receptacle portions 254, 255 of receptacle 252 were shaped in order to engage tightly, or pinch, planar portions 224, 225 as projection 222 was completely inserted into receptacle 252. Similarly, corner portions 286, 287 of receptacle 226 were made wide and round, while planar receptacle portions 258, 259 were shaped to engage tightly planar portions 228, 229 of projection 226. Tolerances during course alignment were about 2 mm. Tolerances after complete, fine alignment were only about 0.2 mm.

Generally, a receptacle has a shape that matches, at least roughly, the shape of the projection to be inserted. For example, if the projection is L-shaped, then the receptacle is typically roughly L-shaped. As described above with reference to FIG. 6, the shape of the receptacles did not exactly match the shape of the projections. The important characteristic of receptacle is that it engage portions of a projection to provide proper alignment, small tolerances, and desired physical support.

The term "base region" refers to a region of the first unit proximate to the base panel. Typically, the base region includes, or surrounds, the base panel. In certain embodiments, the base region comprises a single piece of material, including the base panel. Typically, the base region includes one or more materials and one or more distinct parts of the first unit. For example, in the embodiment described in detail in this specification, the base region includes the base panel and four corners of the housing proximate to the base panel. The base panel, however, does not necessarily comprise the same rigid material as the rigid housing material. It is a feature of embodiments in accordance with the invention that the base region is an integral part of the first unit proximate to the base panel, and that a projection is an extension of the base region. The base region is "proximate to the base panel" in the sense that a projection extending from the base region and fully engaged by a receptacle in the mounting region of a second unit results in proper alignment of the first and second units.

Embodiments in accordance with the invention have been described herein in which a first unit includes two projections, which are inserted into receptacles in a second unit. It is understood, however, that other embodiments in accordance with the invention include only a single projection, or a plurality of projections greater than two. As explained above, with reference to FIG. 1, even one projection fully engaged in a receptacle in accordance with the invention prevents rotation of a first unit or second unit about the axis formed by the intersection of the first and second planar portions of the projection. The term "engage" and related terms in the specification refer to the holding or "pinching" through friction by a receptacle of the first planar portion and the second planar portion when the projection is fully inserted. Engaging by a receptacle of the first and second planar portions is a distinguishing feature of embodiments in accordance with the invention. In the prior art, a female end of an alignment device typically accommodates a flange or rod or cone-shaped male end, and inhibits lateral movement. Such a prior-art device does not provide convenient course alignment, gradual pinching of the projection for small-tolerance fine alignment, and prevention of rotational movement.

A practical consideration is that in embodiments having a plurality of projections, and therefore a total of four or more planar portions, it is preferable to reduce the tightness of pinching by the receptacle of one or more planar portions. For example, in a system having two projections extending from a base region, if receptacles engage all four planar portions very tightly, then the system may be overconstrained. It is, therefore, often desirable to reduce, or loosen up, the degree of pinching on one of the four planar portions. This permits reasonably convenient full insertion of the two projections into their respective receptacles, while maintaining accurate alignment, close tolerance and desired physical support in accordance with the invention.

Embodiments are described herein showing a projection extending from a corner of a base region of a first unit. It is understood that a projection in accordance with the invention may extend from any location of a base region consonant with particular requirements of use. Embodiments described herein show a first planar portion and a second planar portion of a projection being perpendicular to each other. It is understood that a first planar portion and a second planar portion can define an intersection angle in a range from about 10° to 170°. Practically, the first and second planar portions usually form an angle greater than 20°, and typically in a range of from 45° to 120°. An angle of 90° is preferred and most practical because it conforms to an extension of rigid material from the corner of a first unit, and because a mating receptacle having portions at right angles to each other is easier to fabricate than other angles. Of course, embodiments in accordance with the invention can include three or more planar portions extending in a direction perpendicular to the base panel. In preferred embodiments of the invention, the projection is an extension of rigid base region material. This allows precise alignment of first and second units. In alignment systems typical in the prior art, a guide rod or cone or other appendage is fabricated as a separate piece and attached to a first unit. As a result, these prior art solutions cannot achieve the very tight tolerances achieved in accordance with this invention. Embodiments described in detail herein included a first unit and a second unit having rectangular box shapes. It is understood that various embodiments in accordance with the invention include a first unit or a second unit having various other shapes besides a rectangular box. Similarly, certain embodiments in accordance with the invention include a base panel or a mounting face having non-rectangular shapes. In embodiments described herein, the first unit removable subassembly contained a projection, and a main second unit contained a receptacle. Clearly, a first unit having a projection may be a main assembly unit, and a second unit having a receptacle may be a removable subassembly unit. Or, both units may be movable subassemblies, or both units may be relatively immobile, but interconnected.

Systems in accordance with the invention are useful in a wide variety of circumstances and applications to effect alignment of interconnecting machines, modules and assemblies. It is evident that those skilled in the art may now make numerous uses and modifications of the specific embodiments described, without departing from the inventive concepts. It is also evident that equivalent structures and processes may be substituted for the structures and processes described. Since certain changes may be made in the above embodiments without departing from the scope of the invention, it is intended that all subject matter contained in the above description or shown in the accompanying drawing be interpreted as illustrative and not in a limiting sense. Consequently, the invention is to be construed as embracing each and every novel feature and novel combination of features present in or inherently possessed by the systems and compositions described in the claims below and by their equivalents.

I claim:

1. A system for aligning two units of a modular system, comprising:

a projection extending from a base region of a first unit, the projection having a first planar portion and a second planar portion, the first planar portion and the second planar portion forming an intersection having an intersection angle in a range of from 10° to 170°, the projection extending in a direction substantially perpendicular to a base panel in the base region, the projection having a base end proximate to the base region and a tip end distal from the base region, the tip end being tapered so that the base end has larger dimensions than the tip end; and a receptacle in a mounting region of a second unit, the receptacle having a shape for receiving the projection and engaging the first and second planar portions.

2. A system as in claim 1, wherein the intersection angle between the first planar portion and the second planar portion is about 90°.

3. A system as in claim 1, wherein the receptacle is a slot in the mounting region.

4. A system as in claim 1, wherein the tip end of the projection fits loosely in the receptacle, and the receptacle holds the base end of the projection tightly when the projection is inserted fully into the receptacle such that the base panel of the first unit is in contact with at least a portion of a mounting face of the second unit.

5. A system as in claim 1, wherein the intersection of the first planar portion and the second planar portion forms a substantially linear axis perpendicular to the base region, and the receptacle prevents rotation of the first unit or the second unit around the linear axis when the projection is inserted fully into the receptacle such that the base panel of the first unit is in contact with at least a portion of a mounting face of the second unit.

6. A system as in claim 1, wherein the receptacle tightly engages the first planar portion and a second planar portion at the base end, and does not tightly engage the intersection of the first and second planar portions.

7. A system as in claim 1, wherein at least a portion of the base region of the first unit comprises a rigid material, and the projection is an extension of the rigid material.

8. A system as in claim 1, wherein the first unit is on-line replaceable.

9. A system as in claim 1, further comprising: a plurality of projections extending from the base region, and a plurality of receptacles located in the mounting region.

10. A system as in claim 1, wherein the second unit is on-line replaceable.

11. A system as in claim 7, wherein the first planar portion and the second planar portion are formed by a fold in the projection.

12. A system as in claim 7, wherein the first unit has a shape of a rectangular box and comprises a top, a bottom, a first side, a second side, and a base panel perpendicular to the top, bottom, first side and second side.

13. A system as in claim 8, wherein the first unit comprises a power supply subassembly and the second unit comprises a computer assembly.

14. A system as in claim 12, wherein the first unit comprises a housing of rigid material, the housing includes the top, the bottom, the first side and the second side, and the projection is an extension of the housing.

15. A system as in claim 13, wherein a plurality of power supply subassemblies is connected to the computer assembly.

16. A system as in claim 14, wherein the rigid material comprises sheet metal.

17. A system as in claim 14, wherein the housing at the base end includes a first top corner region, a second top corner region, a first bottom corner region, and a second bottom corner, and the projection is an extension of a region of the housing selected from the group consisting of the first top corner region, the second top corner region, the first bottom corner region, and the second bottom corner region.

18. A system as in claim 17, comprising a plurality of projections extending from regions of the housing selected from the group consisting of the first top corner region, the second top corner region, the first bottom corner region, and the second bottom corner region, and further comprising a plurality of receptacles located in the mounting region for receiving and engaging the plurality of projections.

* * * * *